(12) United States Patent
Kodama et al.

(10) Patent No.: US 6,911,893 B2
(45) Date of Patent: Jun. 28, 2005

(54) CERAMIC ELECTRONIC COMPONENT

(75) Inventors: Masahiro Kodama, Kusatsu (JP);
Atsushi Kishimoto, Kusatsu (JP);
Mitsutoshi Kawamoto, Yasu-gun (JP);
Hideaki Niimi, Hikone (JP); Akira
Ando, Omihachiman (JP)

(73) Assignee: Murata Manufacturing Co., Ltd.,
Kyoto (JP)

( * ) Notice: Subject to any disclaimer, the term of this
patent is extended or adjusted under 35
U.S.C. 154(b) by 0 days.

(21) Appl. No.: 10/022,715

(22) Filed: Dec. 18, 2001

(65) Prior Publication Data

US 2002/0130318 A1 Sep. 19, 2002

(30) Foreign Application Priority Data

Jan. 18, 2001 (JP) ........................................ 2001-010436

(51) Int. Cl.⁷ .................................................. H01C 7/10
(52) U.S. Cl. ................................. 338/22 R; 338/22 SD
(58) Field of Search ................................ 338/22 R, 20, 338/21, 22 SD

(56) References Cited

U.S. PATENT DOCUMENTS

| | | | | |
|---|---|---|---|---|
| 3,642,527 A | * | 2/1972 | Purdes et al. ..................... | 438/3 |
| 3,720,543 A | * | 3/1973 | Bockstie, Jr. ..................... | 338/20 |
| 3,745,504 A | * | 7/1973 | Mooney ............................ | 338/15 |
| 3,791,863 A | * | 2/1974 | Quirk .............................. | 392/459 |
| 4,409,728 A | * | 10/1983 | Ellis et al. ...................... | 29/613 |
| 5,055,140 A | * | 10/1991 | Kumada et al. .................... | 136/212 |
| 5,210,516 A | * | 5/1993 | Shikama et al. ................... | 338/22 R |
| 5,493,266 A | * | 2/1996 | Sasaki et al. ..................... | 338/22 R |
| 5,547,907 A | * | 8/1996 | Katsumata et al. ................. | 501/76 |
| 5,750,264 A | * | 5/1998 | Ueno et al. ....................... | 428/426 |
| 5,815,063 A | * | 9/1998 | Goto et al. ....................... | 338/22 R |
| 5,907,271 A | * | 5/1999 | Hirano et al. ..................... | 338/22 R |
| 6,198,618 B1 | * | 3/2001 | Ohtani et al. ..................... | 361/306.3 |
| 6,400,253 B1 | * | 6/2002 | Jinno et al. ....................... | 338/332 |
| 6,588,094 B2 | * | 7/2003 | Furukawa et al. .................. | 29/610.1 |
| 2003/0030192 A1 | * | 2/2003 | Niimi et al. | |

FOREIGN PATENT DOCUMENTS

| | | |
|---|---|---|
| JP | 50-27986 | 3/1975 |
| JP | 59-8323 | 1/1984 |
| JP | 61-181105 | 8/1986 |
| JP | 62-252103 | 11/1987 |
| JP | 63-55904 | 3/1988 |
| JP | 4-267320 | 9/1992 |
| JP | 5-275272 | 10/1993 |
| JP | 5-299286 | 11/1993 |
| JP | 6-342734 | 12/1994 |
| JP | 63-156378 | * 12/1999 |
| JP | 2000-106304 | * 4/2000 |

OTHER PUBLICATIONS

Machine translation and abstract transl. of Ogose 63–156378 (Dec. 1999).*
06–342734 abstract, to Nohara patent (Dec. 12, 1994).*
05–275272 abstract to Kunio et al. patent (Oct. 22, 1993).*
Copy of Korean Office Action dated Jul. 9, 2003 (and English translation of relevant portion).
Copy of The People's Republic of China Office Action dated Mar. 26, 2004 (and English translation of same).
Copy of Japanese Examination Report dated Aug. 24, 2004 (and English translation of same).

* cited by examiner

Primary Examiner—Karl D. Easthom
(74) Attorney, Agent, or Firm—Dickstein, Shapiro, Morin & Oshinshky, LLP.

(57) ABSTRACT

A ceramic electronic component includes a component body having semiconductive ceramic layers and internal electrodes. The semiconductive ceramic layers and the internal electrodes are alternately laminated. The semiconductive ceramic layers have a relative density of about 90% or less and contain no sintering additives. The component body is provided with an external electrode on each side thereof. The ceramic electronic component has a low resistance and a high withstand voltage.

11 Claims, 1 Drawing Sheet

CERAMIC ELECTRONIC COMPONENT

BACKGROUND OF THE INVENTION

1. Field of the Invention

The present invention relates to a ceramic electronic component, and more specifically, an electric component for a positive temperature coefficient thermistor (PTC thermistor) and the like comprising a ceramic, such as a semiconductive ceramic mainly containing barium titanate.

2. Description of the Related Art

Barium titanate semiconductive ceramics have been used for PTC thermistors which are generally used for the demagnetization of cathode-ray tubes, overcurrent protection, and other things. Lowering the resistance of the barium titanate semiconductive ceramics leads to a miniaturized and heavy-current ceramic electronic component, and accordingly, a laminated ceramic electronic component having inner electrodes has been developed.

As technology has progressed, higher reliability for the ceramic electronic component has been demanded. In order to maintain moisture, heat or weather resistance of the ceramic electronic component, the surface thereof is conventionally coated with an organic resin or an inorganic glass to form a protective layer, thereby preventing the degradation of the reliability. In particular, a ceramic electronic component has been improved in reliability, for example, by using materials having a small difference of the thermal expansion coefficients between the component and the protective layer thereof as disclosed in Japanese patent publication No. 3-79842.

However, electrodes of a known laminated-ceramic electronic component have to use a base metal such as Ni to ensure ohmic contact, and therefor the component has to be burned in a reducing atmosphere.

Furthermore, the protective layer of the ceramic electronic component formed by coating an organic resin or an inorganic glass is deteriorated by heat generated by being applied in packaging or generated by surrounding electronic components after board level packaging. Such a protective layer cannot be used for a long time even though the difference of the thermal expansion coefficients between the component and the protective layer thereof is small.

On the other hand, the PTC characteristic of barium titanate semiconductors is lowered by burning in a reducing atmosphere, and consequently the withstand voltage is lowered.

SUMMARY OF THE INVENTION

Accordingly, an object of the present invention is to provide a low resistance ceramic electronic component having a high withstand voltage.

To this end, according to one aspect of the present invention, there is provided a ceramic electronic component comprising a component body and electrodes provided on the surfaces of the component body. The component body comprises a ceramic impregnated with a glass component, having a relative density of about 90% or less.

Pursuant to another aspect of the present invention, there is provided a ceramic electronic component comprising a component body comprising a ceramic mainly containing barium titanate. The ceramic contains no sintering additives and is impregnated with a glass component. The ceramic electronic component also comprises electrodes provided on the surfaces of the component body.

Another aspect of the present invention results in a ceramic electronic component comprising a component body comprising a semiconductive ceramic mainly containing barium titanate and no sintering additives. The semiconductive ceramic is impregnated with a glass component and has a relative density of about 90% or less. The ceramic electronic component also comprises electrodes provided on the surfaces of the component body.

The ceramic electronic component may further comprise internal electrodes and semiconductive ceramic layers mainly containing barium titanate. The semiconductive ceramic layers and the internal electrodes are alternately laminated.

The ceramic electronic component may further comprise a protective layer containing a glass component. The protective layer is provided on a surface of the component body.

Known barium titanate semiconductive ceramics generally contain a sintering additive such as $SiO_2$ and $B_2O_3$, whereas the semiconductive ceramic of the present invention does not contain any sintering additives. The ceramic of the present invention can exhibit a remarkable PTC by slight reoxidation after burning in reducing atmosphere. When a ceramic does not contain any sintering additives, the flux or the like in board level packaging lowers the withstand voltage of the ceramic. However, impregnating the ceramic with a glass component inhibits the withstand voltage from lowering.

By impregnating a ceramic having a relative density of about 90% or less, that is a ceramic containing no sintering additives, with a glass component, the ceramic electronic component of the present invention can exhibit a low resistance and a high withstand voltage.

Accordingly, the present invention provides a low resistance ceramic electronic component having a high withstand voltage, for example, for PTC thermistors.

The objects described above and others, the characteristic features, and the advantages of the present invention will become further clear by the embodiments described below with reference to drawings.

DESCRIPTION OF PREFERRED EMBODIMENTS

EXAMPLE 1

$BaCO_3$, $TiO_2$ and $Sm_2O_3$ were blended to prepare the following powder for semiconductive ceramic composition:

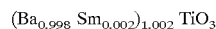

The powder was pulverized with zirconia balls in water for 5 hours and calcined at 1100° C. for 2 hours. After an organic binder was added, the mixture was formed into sheets. Then, Ni internal electrodes were printed thereon. The sheets were stacked and subsequently burned at 1200° C. in a reducing atmosphere of $H_2/N_2$. Next, the sheets were provided with external electrodes formed of Ag and reoxidized at 700° C. in air to prepare the PTC thermistor shown in FIG. 1.

Figure 1:
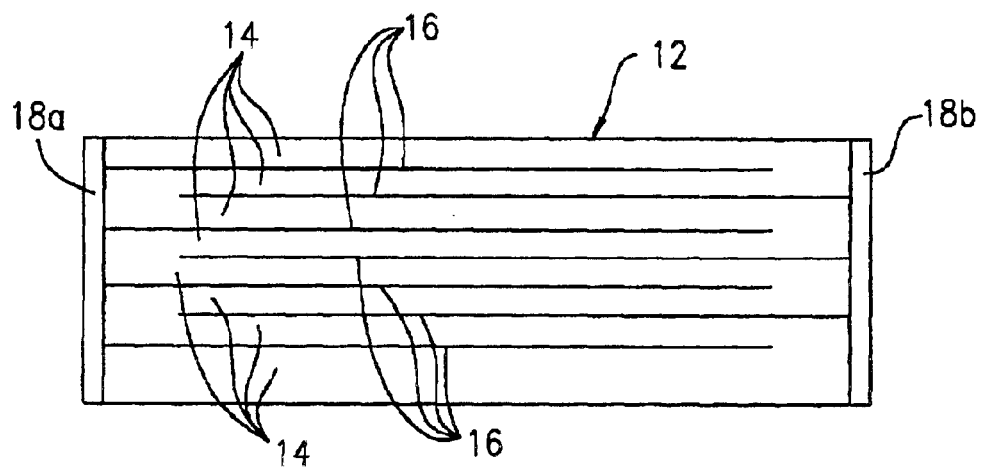
FIG. 1 is a schematic drawing showing an example of a laminated PTC thermistor of the present invention.

The PTC thermistor 10 shown in FIG. 1 comprises a component body 12. The component body 12 comprises a plurality of semiconductive ceramic layers 14 and a plurality of internal electrodes 16. The semiconductive ceramic layers 14 and the internal electrodes 16 are alternately laminated. The internal electrodes 16 are alternately exposed at one side of the component body 12 and the other side. External electrodes 18a and 18b are each provided on a side of the component body 12 and connected with the internal electrodes 16 exposed at the respective sides.

The PTC thermistor 10 was immersed in a Na—Si—O$_2$ glass solution for an hour and heated at 600° C., thereby being impregnated with glass components. The PTC thermistor 10 comprising the semiconductive ceramic was soldered on a printed circuit board, and then the resistance at room temperature and the withstand voltage were measured.

EXAMPLE 2

A PTC thermistor 10 was prepared in the same process as Example 1 except for replacing the glass solution with a Li—Si—O glass solution, and then the resistance at room temperature and the withstand voltage were measured.

EXAMPLE 3

A PTC thermistor 10 was prepared in the same process as Example 1 except for replacing the glass solution with a K—Si—O glass solution, and then the resistance at room temperature and the withstand voltage were measured.

Comparative Example 1

A PTC thermistor was prepared in the same process as Example 1 except that the composition of the semiconductive ceramic further contained SiO$_2$. The composition was:

$(Ba_{0.998} Sm_{0.002})_{1.002} TiO_3 + 0.01 SiO_2$

Then, the resistance at room temperature and the withstand voltage were measured.

Comparative Example 2

A PTC thermistor was prepared in the same process as Example 1 except that the composition of the semiconductive ceramic further contained Al$_2$O$_3$ and SiO$_2$. The composition was:

$(Ba_{0.998} Sm_{0.002})_{1.002} TiO_3 + 0.01 SiO_2 + 0.003 Al_2O_3$

Then, the resistance at room temperature and the withstand voltage were measured.

Comparative Example 3

A PTC thermistor was prepared in the same process as Example 1 except that the composition of the semiconductive ceramic further contained B$_2$O$_3$. The composition is:

$(Ba_{0.998} Sm_{0.002})_{1.002} TiO_3 + 0.005 B_2O_3$

Then, the resistance at room temperature and the withstand voltage were measured.

Comparative Example 4

A PTC thermistor was prepared in the same process as Example 1 except for eliminating the immersing step, and then the resistance at room temperature and the withstand voltage were measured.

The results of the measurements of the resistances and the withstand voltages are shown in Table 1. "PTC log(R250/R25) (digits)" in the table represents the logarithm of the resistance of a PTC thermistor specimen at 250° C. divided by the resistance of the specimen at 25° C.

TABLE 1

| Specimen | Resistance at room temperature (Ω) | PTC log (R250/R25) (digits) | Withstand voltage (V) |
|---|---|---|---|
| Example 1 | 0.5 | 3.5 | 20 |
| Example 2 | 0.5 | 3.5 | 20 |
| Example 3 | 0.5 | 3.5 | 20 |
| Comparative Example 1 | 0.5 | 1.5 | 3 |
| Comparative Example 2 | 0.5 | 1.2 | 2 |
| Comparative Example 3 | 0.5 | 1.2 | 2 |
| Comparative Example 4 | 0.5 | 3.5 | 8 |

Table 1 shows that Comparative Examples 1 to 3, in which sintering additives were added, exhibit significantly low PTCs and low withstand voltages, and Comparative Example 4, in which the PTC thermistor was not impregnated with glass components, exhibits a high PTC but a low withstand voltage. In contrast, Examples 1 to 3 exhibit high PTCs and a high withstand voltage of 20 V.

The following describes PTC thermistors or the like comprising a semiconductive ceramic of which the relative density is about 90% or less, mainly containing barium titanate.

EXAMPLE 4

BaCO$_3$, TiO$_2$ and samarium nitric acid solution were used as starting materials for barium titanate semiconductive ceramics. These materials were weighed such that the molar ratio of Sm to Ti was 0.0012, and were mixed with zirconia balls for 5 hours in pure water. In the formulation, the ratio of Ba to Ti varied. Then the mixture was dried by evaporation and calcinated at 1150° C. for 2 hours to be formed into a powder. The calcinated powder was mixed with a dispersant and pure water and was pulverized. A binder or the like was added to the powder to form a slurry. The slurry was molded into green sheets by the doctor blade method. Internal electrodes were screen-printed with Ni paste on the green sheets. The green sheets were stacked such that the internal electrodes were alternately exposed at one side of the stacked green sheets and the other side. Then the stacked sheets were press-bonded and cut, thereby resulting in a laminate. The top and bottom of the laminate was press-bonded with stacked green sheets on which no internal electrodes were printed. Ni paste was applied on both sides of the laminate to serve as external electrodes.

After the binder was removed from the laminate in air, the laminate was burned at 1200° C. for 2 hours in a strong reducing atmosphere where the ratio of hydrogen to nitrogen was 3:100. Then an ohmic silver paste was applied on the laminate. The laminate was reoxidized at a temperature of 500 to 1000° C. for one hour in air, thereby resulting in the component body 12 of the laminated PTC thermistor 10 shown in FIG. 2.

Figure 2:
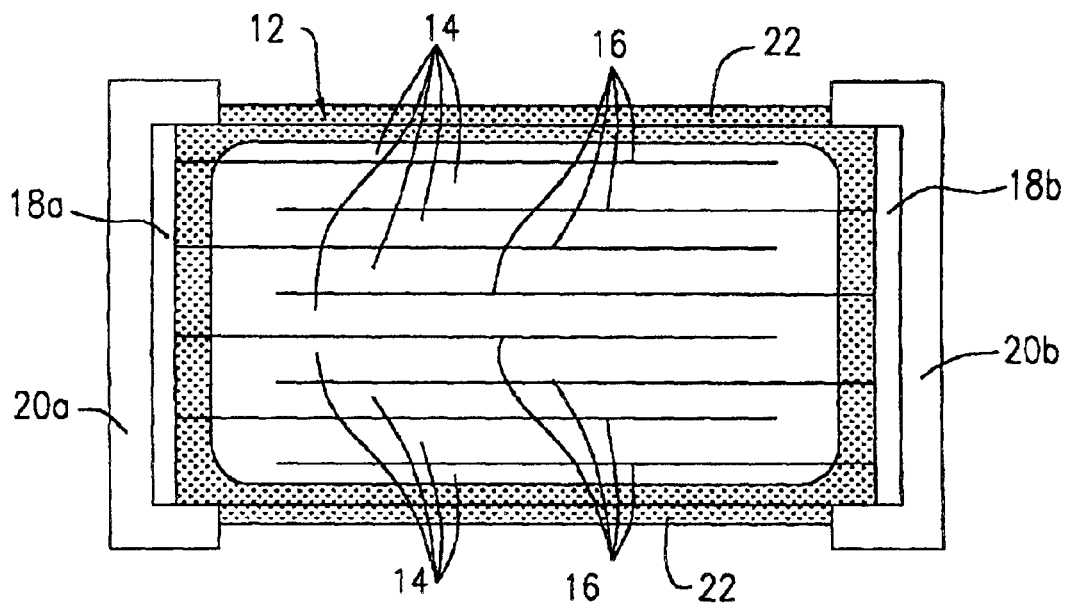
FIG. 2 is a schematic drawing showing another example of the laminated PTC thermistor of the present invention.

The component body 12 of the PTC thermistor 10 shown in FIG. 2 comprises a plurality of semiconductive ceramic layers 14 and a plurality of internal electrodes 16. The semiconductive ceramic layers 14 and the internal electrodes 16 are alternately laminated. The internal electrodes 16 are alternately exposed at one side of the component body 12 and the other side. One external electrode 18a containing Ni is provided on one side of the component body 12 and connected with the internal electrodes 16 exposed on that side. The external electrode 18a is provided with an external electrode 20a containing Ag on the surface thereof. The other external electrodes 18b containing Ni and 20b containing Ag are provided on the other side of the component body 12 in the same manner.

The component body 12 of the PTC thermistor 10 shown in FIG. 2 was immersed in an inorganic glass solution, was vacuumed for 3 minutes, dried at 150° C. for 2 hours and heated at 500° C. for one hour. Thus, the component body 12 was impregnated with glass components, thereby being provided with protective layers 22 with a thickness of 15 μm containing glass components on the surfaces thereof and resulting in the PTC thermistor 10. In this instance, the inorganic glass solution was prepared by diluting a commercial sodium silicate solution with pure water. The $SiO_2$ $Na_2O$ content of the inorganic glass solution was about 10%.

In order to measure the relative density of the semiconductive ceramic layers 14 of the PTC thermistor 10 shown in FIG. 2, a cross section of the semiconductive ceramic layers 14 was observed with an electron microscope. The cross sectional area of semiconductive ceramic layers was calculated by subtracting the cross sectional void area from the entire cross sectional area to obtain the cross sectional area ratio of the semiconductive ceramic layer to the entire area.

For evaluation of the characteristics of the PTC thermistor 10, the PTC thermistor was soldered on a print circuit board by reflowing. Then, voltages were applied between the external electrodes 20a and 20b until the PTC thermistor was broken, and thus the breakdown voltage was measured. If the protective layers 22 provided on the surfaces of the component body 12 do not sufficiently function, flux contained in the solder soaks into the component body 12 during reflowing. When a voltage is applied to the component body 12, the flux burns by the heat generated from the component body 12, and thereby the PTC thermistor is broken at a low voltage. Thus, the quality of the protective layers 22 containing glass components can be determined.

Comparative Examples 5 to 8

Four PTC thermistors for comparison were prepared. Comparative Example 5 having no protective layers 22; Comparative Example 6 having protective layers formed of an acrylic resin; Comparative example 7 having protective layers with a thickness of 5 μm; and Comparative Example 8 having the semiconductive ceramic layers of which the relative density was 95% and of which the thickness of the protective layers was 15 μm.

The relative densities and the breakdown voltages of Comparative Examples 5 to 8 were measured in the same process as Example 4.

The results of the measurements for Example 4 and Comparative Examples 5 to 8 are shown in Table 2.

TABLE 2

| Specimen | Relative density (%) | Breakdown voltage (V) |
|---|---|---|
| Example 4 | 88 | 20 |
| Comparative | 89 | 6 |

TABLE 2-continued

| Specimen | Relative density (%) | Breakdown voltage (V) |
|---|---|---|
| Example 5 | | |
| Comparative Example 6 | 88 | 10 |
| Comparative Example 7 | 88 | 9 |
| Comparative Example 8 | 95 | 7 |

Table 2 shows that while Comparative Examples 5 to 8 exhibit low breakdown voltages of less than 10 V, Example 4 exhibits a high breakdown voltage of 20 V.

A ceramic having a relative density of about 90% or less means that the ceramic was incompletely sintered in the present invention.

In order to allow the relative density to be about 90% or less, for example, the difference between the burning temperature of the mixture of $BaCO_3$ and $TiO_2$, which are materials for the barium titanate semiconductive ceramic powder, and the sintering temperature of the barium titanate semiconductive ceramic powder is determined to be about 150° C. or less.

The reference to sintering additives in the present invention refers to substances capable of helping ceramics sinter, such as $SiO_2$, $B_2O_3$, or $Al_2O_3$.

As a glass component, alkali-silica glass, borosilicate glass, lead borosilicate glass or barium borosilicate glass is used in the present invention. Preferably a glass component of which the softening temperature is about 1000° C. or less is used.

For the impregnation of a glass component, the following methods may be applied:
1. Dissolving an organic compound containing glass components in an organic solvent, and immersing a component body in the glass component solution.
2. Immersing the component body in molten glass.
3. Printing a glass on the component body, heating it to the softening temperature or more to lower the viscosity, and applying pressure.

Impregnating low-density ceramics with a glass component means that:
1. low-density ceramics (which do not contain any sintering additives) are easily reoxidized after reduction burning, thereby having high PTCs, and
2. impregnation of a glass component allows the ceramics to be substantially dense.

For forming the protective layer containing glass components, for example, a sodium silicate solution in which the ratio of $SiO_2$ to $Na_2O$ is 2 to 1 can be used as a material in the present invention. Also, the $Na_2O$ may be replaced with $Li_2O$, $K_2O$, CaO, MgO, or a mixture of $Li_2O$ and $Na_2O$ or the like according to the circumstances. The ratio of $Si_2O$ to $Na_2O$ may be 3 to 1, 4 to 1, or others in view of the viscosity or the solubility.

For coating inorganic glass, the component body may be immersed in the inorganic glass solution, or be painted or sprayed with the inorganic glass solution, and other means may be taken. In addition, by vacuuming the component body impregnated with glass solution to evacuate the air, the inorganic glass layers can be more solidly formed.

Although the present invention has been described in relation to particular embodiments thereof, various changes and modifications can be made thereto without departing from the spirit and the scope of the invention.

What is claimed is:

1. A ceramic electronic component comprising:
   a component body having a surface and comprising a ceramic which comprises semiconductive barium titanate impregnated with a glass, the ceramic having a positive temperature coefficient and a relative density of 90% or less; and
   a pair of spaced electrodes on the surface of the component body.

2. A ceramic electronic component according to claim 1, further comprising a protective layer comprising a glass on a surface of the component body.

3. A ceramic electronic component according to claim 1, wherein the glass impregnated in the ceramic has a softening point which does not exceed about 1,000° C.

4. A ceramic electronic component according to claim 1, wherein the ceramic comprises a stack of a plurality of layers of a semiconductive barium titanate, and at least two internal electrodes disposed in the stack at different interfaces between said layers, each of said two internal electrodes being electrically connected to a different one of the pair of spaced electrodes on the surface of the component body.

5. A ceramic electronic component according to claim 4, further comprising a protective layer comprising a glass on a surface of the component body.

6. A ceramic electronic component according to claim 5, wherein the glass impregnated in the ceramic has a softening point which does not exceed about 1,000° C.

7. A ceramic electronic component according to claim 1, wherein the ceramic comprises a barium titanate free of sintering additives.

8. A ceramic electronic component according to claim 7, further comprising a protective layer comprising a glass on a surface of the component body.

9. A ceramic electronic component according to claim 7, wherein the ceramic comprises a stack of a plurality of layers of said ceramic, and at least two internal electrodes disposed in the stack at different interfaces between said layers, each of said two internal electrodes being electrically connected to a different one of the pair of spaced electrodes on the surface of the component body.

10. A ceramic electronic component according to claim 9, further comprising a protective layer comprising a glass on a surface of the component body.

11. A ceramic electronic component according to claim 10, wherein the glass impregnated in the ceramic has a softening point which does not exceed about 1,000° C.

* * * * *